United States Patent [19]
Chino et al.

[11] Patent Number: 5,147,827
[45] Date of Patent: Sep. 15, 1992

[54] METHOD FOR PRODUCING A PASSIVATION FILM OF INP COMPOUND SEMICONDUCTOR

[75] Inventors: Toyoji Chino, Toyonaka; Kenichi Matsuda, Moriguchi; Jun Shibata, Kawachinagano, all of Japan

[73] Assignee: Matsushita Electric Industrial Co., Ltd., Osaka, Japan

[21] Appl. No.: 711,023

[22] Filed: Jun. 6, 1991

[30] Foreign Application Priority Data

Jun. 6, 1990 [JP] Japan .................. 2-147806

[51] Int. Cl.⁵ .................................... H01L 21/208
[52] U.S. Cl. ............................ 437/237; 437/245; 437/234; 437/230; 148/DIG. 16; 205/157
[58] Field of Search .................. 437/236, 237, 245; 148/DIG. 81, DIG. 118; 204/57, 42, 56.1

[56] References Cited

U.S. PATENT DOCUMENTS

| | | | |
|---|---|---|---|
| 3,798,139 | 3/1974 | Swartz | 437/237 |
| 3,844,904 | 10/1974 | Yahalom | 204/56.1 |
| 3,859,178 | 1/1975 | Logan et al. | 148/DIG. 118 |
| 3,914,465 | 10/1975 | Dyment et al. | 437/237 |
| 4,026,741 | 5/1977 | Chang et al. | 204/56.1 |

OTHER PUBLICATIONS

Ermanis et al., "Anodic Oxidation of Gallium Phosphide in Aqueous Hydrogen Peroxide", J. Electrochem. Soc., Dec. 1974, vol. 121, No. 12, pp. 1665-1667.
Swartz, "Preliminary Results on the Oxidation of GaAs and GaP During Chemical Etching", J. Electrochem. Soc., Apr. 1971, vol. 118, No. 4, pp. 657-658.

Primary Examiner—Olik Chaudhuri
Assistant Examiner—Ken Horton
Attorney, Agent, or Firm—Wenderoth, Lind & Ponack

[57] ABSTRACT

A device such as a phototransistor, a photodiode, a laser diode or the like including a compound semiconductor coated with a stable passivation film to reduce leakage current is disclosed. The passivation film includes oxygen, a metallic element and constituent elements of the device, and the concentration of the elements included in the passivation film changes gradually through the interface between the passivation film and the device. Such a passivation film is formed by the oxidation or anodic oxidation of a device soaked in an aqueous solution of hydrogen oxide containing metallic ions such as $Fe^{2+}$, $Fe^{3+}$, $Cu^+$, $Cu^{2+}$, $Co^{2+}$ or $Cr^{2+}$ under the control of the temperature of the solution.

2 Claims, 13 Drawing Sheets

METHOD FOR PRODUCING A PASSIVATION FILM OF INP COMPOUND SEMICONDUCTOR

BACKGROUND OF THE INVENTION

The present invention relates to compound semiconductor devices coated with a passivation film which is effective to compound semiconductors including InP and GaAs and manufacturing method thereof.

Previously, an $Si_4N_3$ film and an $SiO_2$ film have been used as passivation films for semiconductor devices. However, especially for compound semiconductors, stress generated at an interface between a passivation film and the semiconductor surface due to the difference of the coefficient of expansion and damage on the semiconductor surface generated in a film deposition process were problems to be solved.

On the other hand, an oxide film as a passivation film is formed on a surface of compound semiconductor by oxidizing the compound semiconductor with aqueous solution of hydrogen peroxide. Refer for example to J. Electrochem. Soc. 118 (1971) pp. 657–658 and Appl. Phys. Lett. 18 (1971) pp. 304–307.

It has been known that an oxidizing agent is prepared by adding $Fe^{2+}$, $Fe^{3+}$, $Cu^+$, $Cu^{2+}$, $Co^{2+}$ or the like to aqueous solution of hydrogen peroxide. Refer for example to "Oxidation and Reduction" (Maruzen, Tokyo, 1978) pp 682–684. This agent has an organic compound as an object for oxidation. The metallic ions included in the oxidizing agent act only as a catalyst, and oxides or hydroxides of metallic ions do not deposit on a specimen. Because physical or chemical adsorption of an oxide or hydroxide of metallic ion takes place on the surface of a compound semiconductor, the deposition of such oxides and hydroxides takes place if a specimen is a compound semiconductor.

However, there were problems to be solved on such a passivation film. First, crystal defects are generated for example due to stress caused by the difference of the coefficient of expansion between the film and the surface of the compound semiconductor, or due to damage of the semiconductor surface formed by diffusion of constituent element atoms into the passivation film and formed in a deposition process of the film. The crystal damages become recombination centers to enhance leakage current. Second, when an oxide film is formed on a surface of compound semiconductor with aqueous solution of hydrogen peroxide, the reaction is very sensitive to impurities contained in the solution and pH so that the reproductivity and stability of the passivation film are bad. Further, an oxide film produced in this way has a relatively large leakage current of $10^{-5}$ to $10^{-6}$ A/cm$^2$. Further, when the growth of oxide film starts, active state-to-nonactive state transition occurs to dissolve the semiconductor partly. However, the transition occurs with difficulty if only hydrogen peroxide is used, so that it is one of the factors of the instability of the reaction.

SUMMARY OF THE INVENTION

It is an object of the present invention to provide a semiconductor device with little leakage current having a stable passivation film on a compound semiconductor.

It is another object of the present invention to provide a manufacturing method of a semiconductor device having a passivation film for a compound semiconductor reproducibly.

In order to solve these problems, a semiconductor device according to the present invention comprises an active region including a compound semiconductor portion and a passivation film for passivating the surface of the compound semiconductor portion, which passivation film comprises an insulator layer including oxygen, hydrogen, metallic elements and constituent elements of the compound semiconductor portion, the concentrations of the elements included in the passivation film changing gradually through the interface between the passivation film and the compound semiconductor portion. Then, the amount of crystal damage formed at the interface between the compound semiconductor portion and the passivation is suppressed. When a passivation film is deposited on a compound semiconductor with hydrogen peroxide, metallic ions such as $Fe^{2+}$, $Fe^{3+}$, $Cu^+$, $Cu^{2+}$, $Co^{2+}$ or $Cr^{2+}$ are added to deposit oxides and hydroxides of these metallic ions on the surface of the semiconductor, while an oxide film of semiconductor is also formed with use of the catalytic action of the metallic ions. Thus, metallic ions to be added react on the surface of semiconductor so that the oxides and hydroxides of metallic ions are deposited on the surface of semiconductor while the other metallic ions not related to the deposition act as a catalyst to form an oxide film on the surface of semiconductor.

It is an advantage of a semiconductor device according to the present invention, with a passivation film consisting of oxides and hydroxides of metallic ions and an oxide film of semiconductor, that the passivation film is formed stably and reproducibly, and that the leakage current can be reduced.

BRIEF EXPLANATION OF THE FIGURES

Further objects and advantages of the present invention will be apparent from the following description of the embodiments of the present invention with reference to the drawings, in which.

DETAILED DESCRIPTION OF THE INVENTION

Preferred embodiments of the present invention will be explained below with reference to the drawings.

Figure 1:
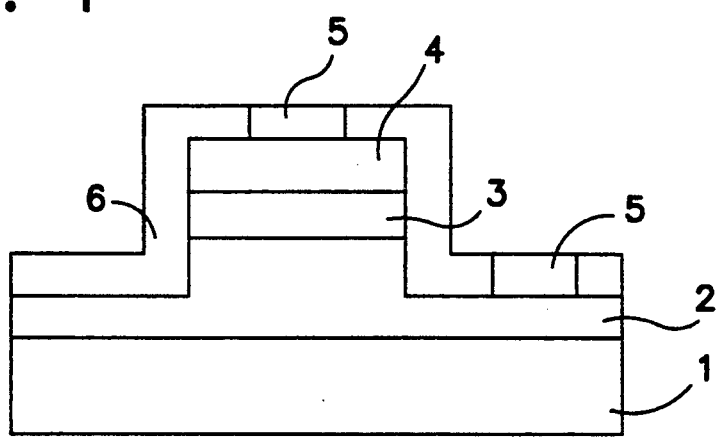
FIG. 1 is a schematic sectional view of a phototransistor.

FIG. 1 shows a schematic sectional view of a phototransistor, wherein an emitter 2 made of n-InP, a base 3 made of p-InGaAsP and a collector 4 made of n-InP or n-INGaAsP are applied successively to an InP substrate 1. Further, a passivation film 6 coats the layers 1, 2 and 3, and two electrodes 5 are connected to the emitter 2 and to the collector 4.

Figure 2:
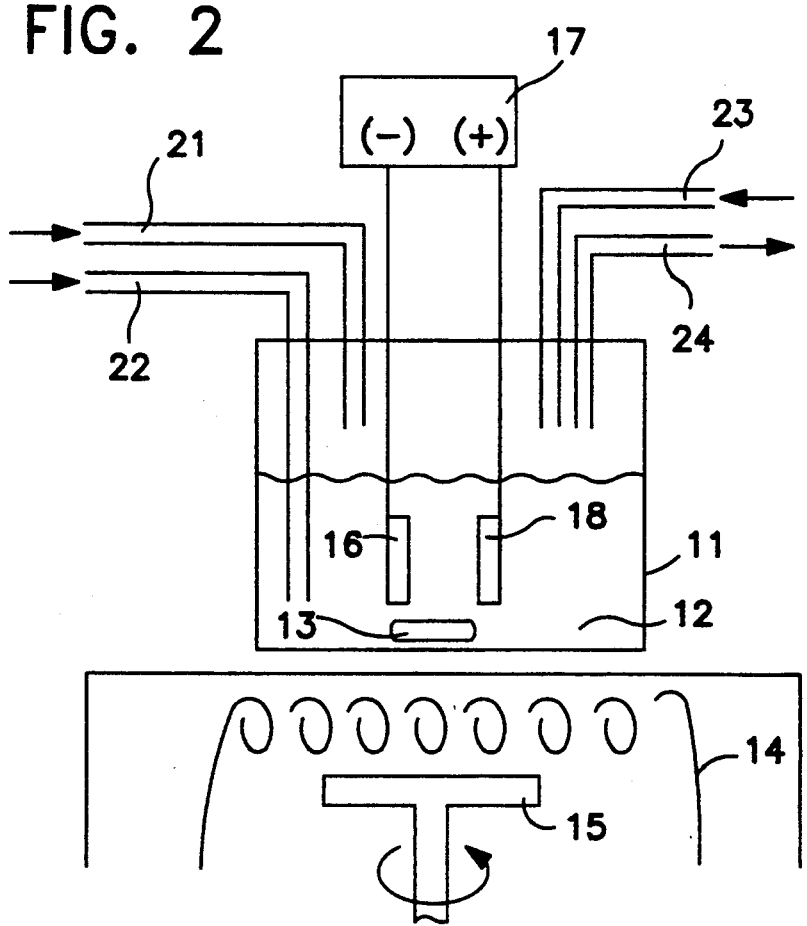
FIG. 2 is a schematic sectional view of an apparatus for producing a passivation film.

FIG. 2 shows a schematic sectional view of an apparatus for producing a passivation film, wherein a mixture solution 12 of hydrogen peroxide aqueous solution of hydrogen peroxide and metallic ions is contained in a reacting chamber 11. A pipe 21 for introducing hydrogen peroxide solution, a pipe 22 for introducing nitrogen gas, a pipe 23 for introducing metallic ions and a pipe 24 for evacuating nitrogen gas are connected to the reacting chamber 11. The solution 12 is stirred with a stirrer 13 operated by a stirrer rotator 15, while the temperature of the solution is controlled with a heater 14. A sample (substrate) 18 for coating a passivation film is soaked in the solution 12 for a prescribed time according to the thickness to be realized.

In case of anodic oxidation, a cathode 16 and a sample (substrate) 18 both connected to an electric power source 17 are inserted into the solution 12.

Figure 3:
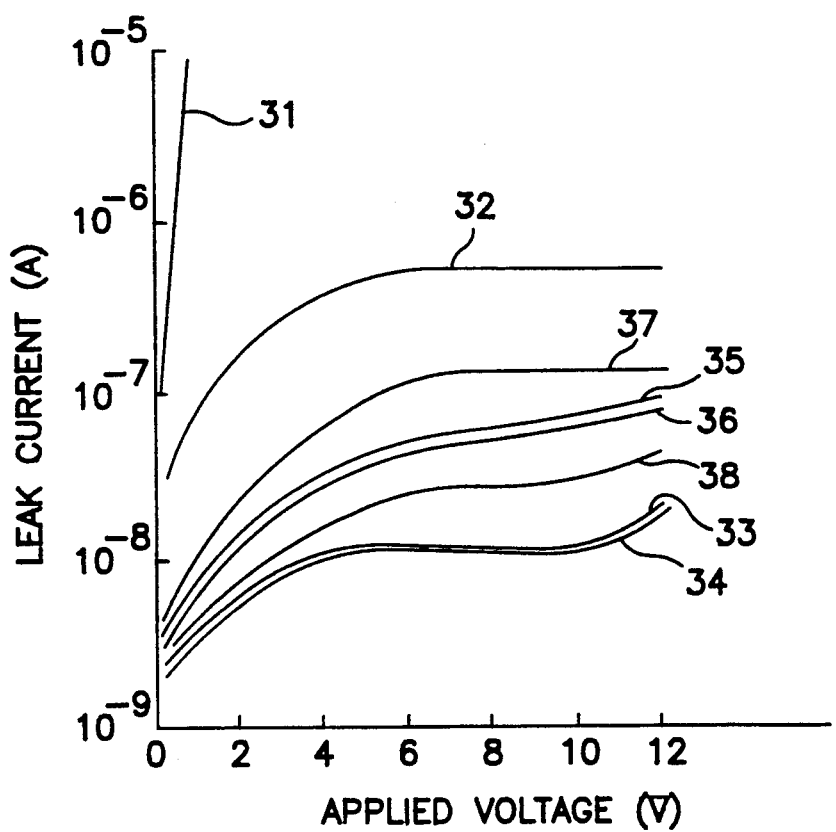
FIG. 3 is a graph of leakage current plotted against bias voltage.

FIG. 3 shows the data of leakage current of various phototransistors with passivation films, to be explained below, plotted against the applied voltage (bias voltage), wherein the numeral 31 designates a curve for a passivation film made of $SiO_2$, and 32 for a passivation film made of $Si_3N_4$ for comparison with passivation films of embodiments of the present invention, while curves 33 to 38 relate to passivation films of embodiments of the present invention. The numeral 33 designates a curve for a passivation film produced with use of hydrogen peroxide and $Fe^{2+}$, the numeral 34 for a passivation film with use of hydrogen peroxide and $Fe^{3+}$, the numeral 35 for a passivation film with use of hydrogen peroxide and $Cu^+$, the numeral 36 for a passivation film with use of hydrogen peroxide and $Cu^{2+}$, the numeral 37 for a passivation film with use of hydrogen peroxide and $Co^{2+}$, while the numeral 38 for a passivation film with use of hydrogen peroxide and $Cr^{2+}$, according to the present invention. The data show clearly that the leakage current is improved largely by using a passivation film of the present invention. This shows that these passivation films are formed while suppressing the generation of crystal defects.

EXAMPLE 1

In this Example, an aqueous solution of hydrogen peroxide containing ferrous chloride is used for producing a passivation film for a phototransistor.

First, aqueous solution of 30% of hydrogen peroxide is supplied through the pipe 22, and powders of ferrous chloride are supplied through the pipe 23 so as to dissolve it in the solution 12. Then, after the solution 12 is heated to a prescribed temperature with the heater 14, a sample 18 of phototransistor is soaked in the solution 12 and then nitrogen gas is introduced through the pipe 21 into the solution 12 in order to prevent the adherence of bubbles on the surface of the sample 18 and to form homogeneously a passivation film on the surface of the sample 18. The solution 12 is stirred with the stirrer 13.

A passivation film 6 can be deposited on the sample 18 if the concentration of ferrous chloride is one PPM or more relative to the aqueous solution of hydrogen peroxide and the temperature of the solution is kept between 0° and 115° C. The optimum conditions are as follows: concentration of the ferrous chloride between 250 and 2000 PPM, temperature of the solution between 50° and 105° C., and the oxidizing time between a half and one hour. Under these conditions, a passivation film of thickness between 50 and 1100 Å can be formed.

In the reaction for forming a passivation film 6, a portion of the $Fe^{2+}$ ions act as a catalyst to generate oxygen:

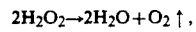

wherein the generated oxygen oxidizes the sample (substrate) 18 to form an oxide film. Further, the following reactions will take place:

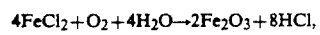

and

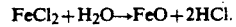

The interaction with the sample 18 takes place, and $Fe_2O_3$: and FeO are deposited on the surface of the sample to be absorbed physically or chemically. Still further, the following reaction takes place:

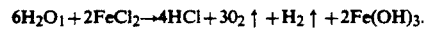

Thus, iron hydroxide is also deposited on the surface of the sample 18, while at the same time, the oxygen to be generated will oxidize the sample 18 to form an oxide film.

As explained above, in the presence of $Fe^{2+}$ ions added to the hydrogen peroxide solution, ferrous oxide, ferric oxide and iron hydroxide are deposited on the surface of compound semiconductors of the sample (substrate) 18, while a large amount of oxygen necessary for oxidation is generated by the decomposition of hydrogen peroxide under the catalytic action of $Fe^{2+}$ ions to form an oxide film on the compound semiconductors of the sample 18. Therefore, a passivation film 6 can be formed on the sample 18 stably and reproducibly.

Figure 4:
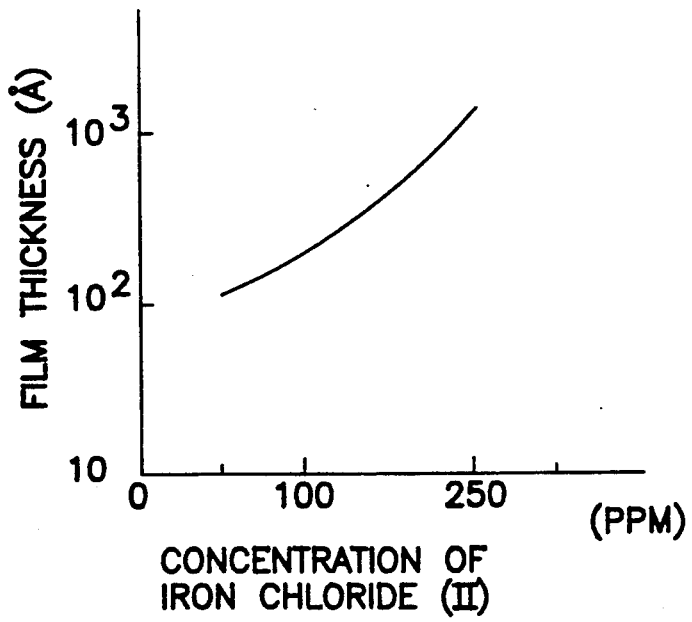
FIG. 4 is a graph of film thickness plotted against the concentration of ferrous chloride added to hydrogen peroxide solution.
Figure 5:
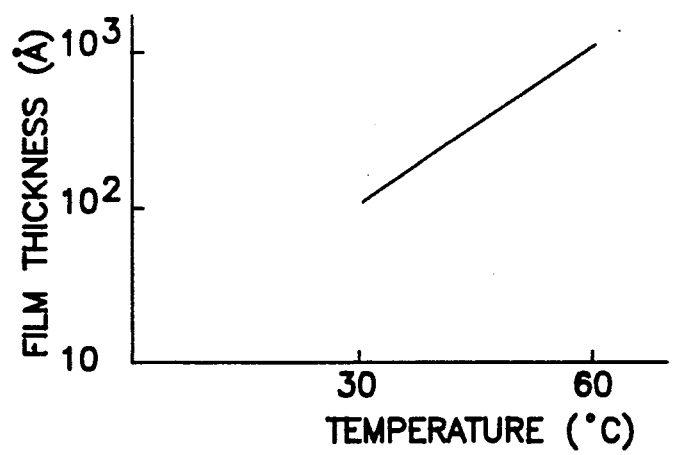
FIG. 5 is a graph of film thickness plotted against the temperature of the solution containing ferrous chloride.

The curve 33 in FIG. 3 shows that the leakage current of a passivation film of a sample of this Example is small. FIG. 4 shows a relation of the thickness of passivation film 6 produced at 30° C. plotted against the concentration of ferrous chloride to be added with respect to the hydrogen peroxide solution, while FIG. 5 shows a relation of the thickness of a passivation film 6, produced at 50 PPM of concentration of ferrous chloride, plotted against the temperature of the solution 12.

Figure 6A:
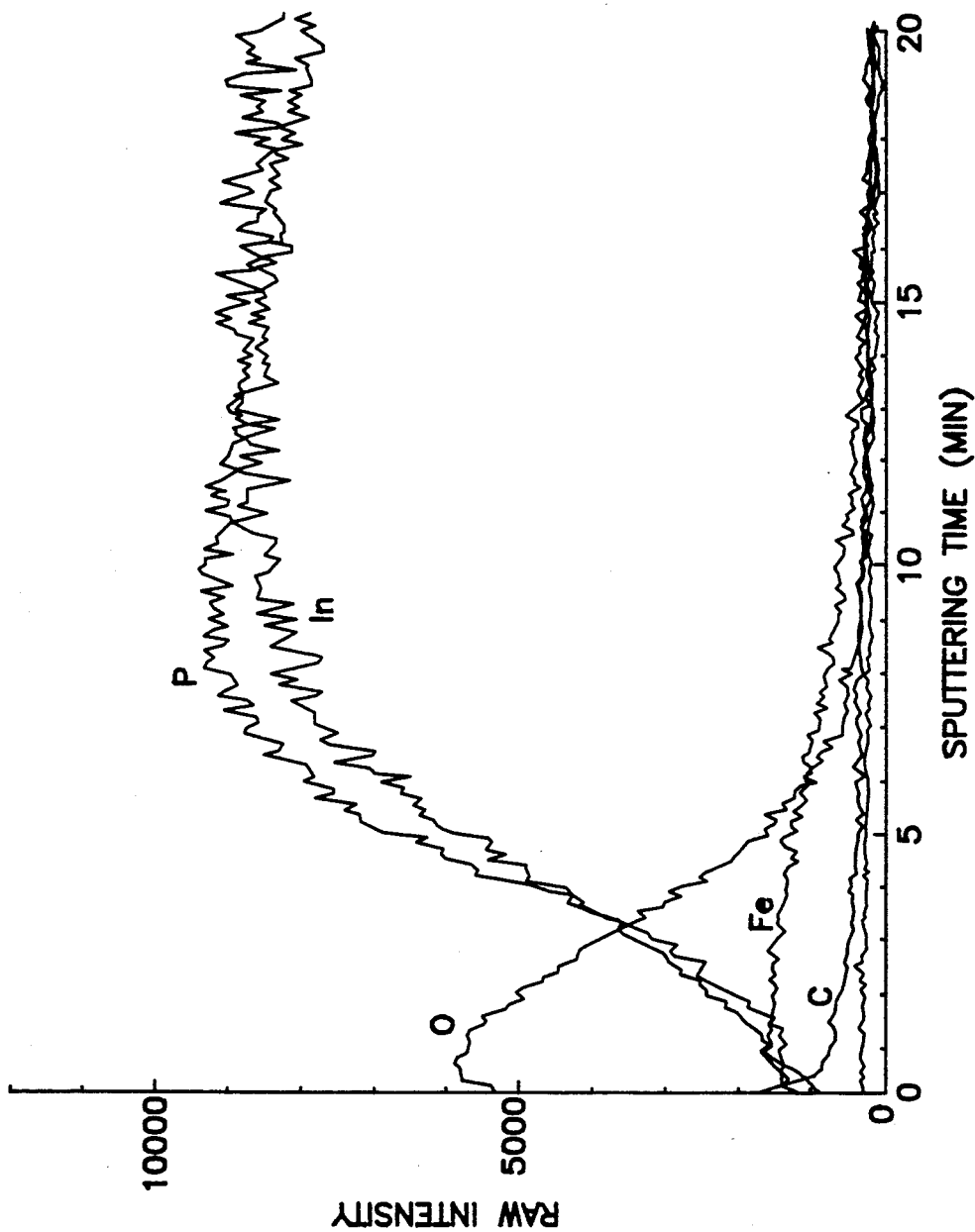
FIG. 6(a) is a profile of Auger spectra of a passivation film according to the present invention.

As will be explained later with reference to FIGS. 6(a)–6(c), the composition of the passivation film according to the invention changes continuously in the depth direction. The film thickness measurements shown in FIG. 5 and other Figures to be explained later is performed with use of Auger spectra analysis. The surface of a passivation film is cut successively by sputtering with Argon for each Auger spectra measurement, so that Auger profiles can be obtained in the depth direction successively, as shown in FIG. 6(a). Sputter rate or the film thickness cut in a sputtering time is measured beforehand. Then, the sputtering time at which the signal intensity of indium becomes a half of the signal intensity at the inside of the device is obtained from the charts as shown in FIG. 6(a), to be converted to the depth with the sputtering rate. The obtained depth is defined as the film thickness in the film thickness measurements in the Examples of the invention.

EXAMPLE 2

In this Example, an aqueous solution of hydrogen peroxide containing ferrous chloride is also used for producing a passivation film 6 for a phototransistor as in Example 1.

The formation of a passivation film 6 is performed similarly to Example 1, and a sample 18 of phototransistor as an anode and a cathode 16 of platinum are soaked in the solution 12 and an electric current is supplied from the electric power source 17 between the sample 18 and the cathode 16 for a prescribed time for anodic oxidation of the sample 18.

A passivation film 6 can be deposited if the electric current density is kept between 0.1 and 100 mA/cm$^2$ and the optimum condition is between 1 and 3 mA/cm$^2$. The conditions on the temperature of the solution 12 and the concentration of ferric chloride are the same as those in Example 1. The oxidizing time is between a half and one hour. By flowing a current in the sample 18, $O^{2-}$ ions are attracted to the sample 18 due to the Coulomb force, while the electrolysis of water takes place to generate oxygen for promoting the reaction. Under these conditions, a passivation film of thickness 2000 Å or more can be formed. The reaction formulas for generation ferrous oxide, ferric oxide, and iron hydroxide are the same as in Example 1.

As explained above, in the presence of $Fe^{3+}$ ions, ferrous oxide, ferric oxide and iron hydroxide are deposited on the surface of the sample (substrate) 18, while a large amount of oxygen necessary for oxidation is generated to form an oxide film on the sample 18. Therefore, a passivation film 6 can be formed on the sample 18 stably and reproducibly.

It is an advantage of the manufacturing method of this Example that the reaction time can be shortened.

The curve 33 in FIG. 3 shows that the leakage current of a passivation film of this Example is small.

FIG. 6(a) is a profile of Auger spectra for composition analysis of a film including $Fe^{2+}$ according to Example 1 formed on a phototransistor shown in FIG. 1, wherein InGaAsP is grown epitaxially on an InP substrate. The abcsissa of sputtering time corresponds to the distance in the depth direction of the film. The data displays that the passivation film 6 consists not only of iron and oxygen, but also of indium and phosphorus, though the contents of iron and oxygen are larger near the surface as expected. The contents of indium and phosphorus increase with increasing depth continuously, while those of oxygen and iron decrease continuously from the surface to the inside of the InP layer. Though carbon is detected, it is not included in the passivation film due to the oxidation according to the invention, but it is ascribed to the carbon of $CO_2$ gas absorbed on the surface of the sample or to the carbon of the oil for the vacuum pump used to evacuate the measurement part of the Auger spectral apparatus.

Figure 6B:
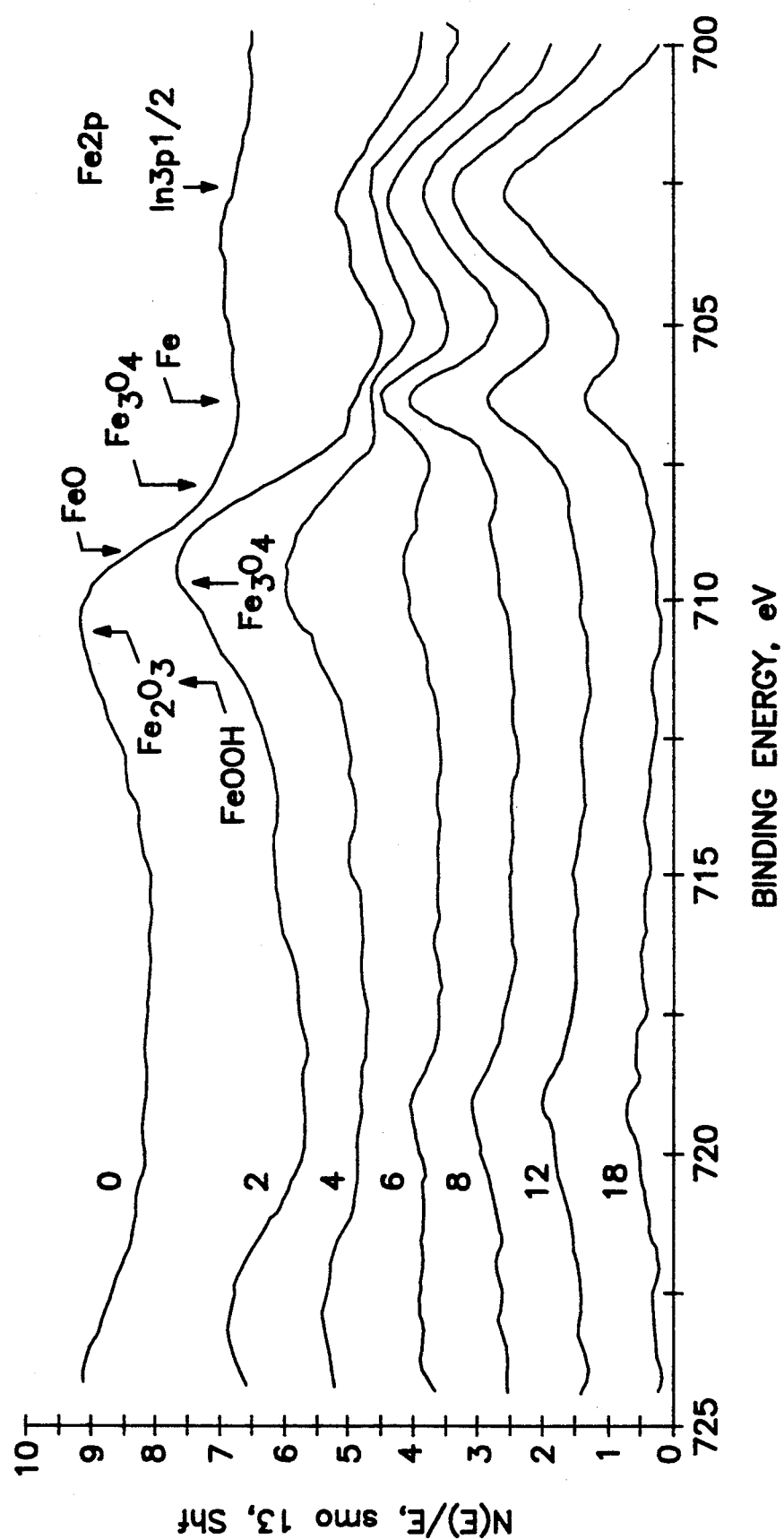
FIGS. 6(b) and 6(c) are profiles of ESCA spectra of Fe2p and O1s, respectively, of a passivation film according to the present invention.
Figure 6C:
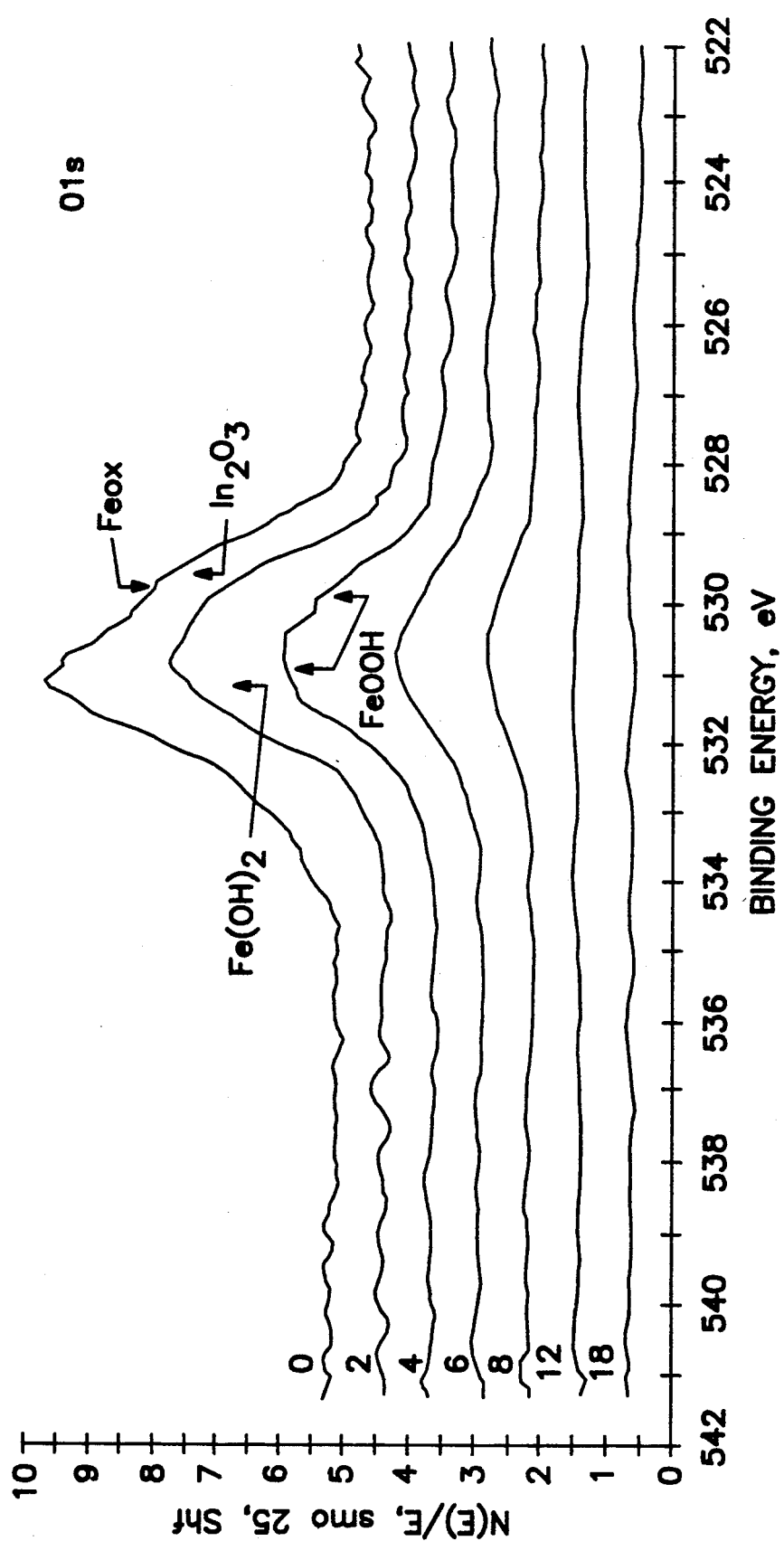

Hydrogen can not be detected by Auger spectra, but profiles of ESCA spectra shown in FIGS. 6(b) and (c) shows that the film contains hydrogen. ESCA profile is related the energy states of an atom combined with other atoms. FIGS. 6(b) and (c) show the energy states of iron (Fe2p) and of oxygen (O1s), respectively, plotted against binding energy. The numerals 0, 2, 4, ..., 18 designate the sputter time in the unit of minute to reduce the thickness of the film, and the curves in FIGS. 6(b) and (c) show the results of analysis in the depth direction of the film. That is, the curve "0" displays the combination energy (energy state) of iron at the surface of the film, while the curve "2" shows that of iron at the depth in correspondence to 2 minutes of sputtering time. It is observed that the combination of FeOOH is detected in the ESCA profile of Fe2p while the combinations of FeOOH and Fe(OH)$_2$ are detected in the ESCA profile of O1s at and near the surface of the film. In other words, the passivation film includes hydrogen.

EXAMPLE 3

In this Example, an aqueous solution of hydrogen peroxide containing ferric chloride is used for producing a passivation film for a phototransistor.

First, aqueous solution of 30% hydrogen peroxide is supplied through the pipe 22, and powders of ferric chloride are supplied through the pipe 23 so as to dissolve them in the solution 12. Then, after the solution 12 is heated to a prescribed temperature with the heater 14, a sample 18 of phototransistor is soaked in the solution 12, and then nitrogen gas is introduced through the pipe 21 into the solution 12 in order to prevent the adherence of bubbles on the surface of the sample 18 and to form homogeneously a passivation film on the surface of the sample 18. The solution is stirred with the stirrer 13.

A passivation film 6 can be deposited if the concentration of ferric chloride is one PPM or more relative to the aqueous solution of hydrogen peroxide and the temperature of the solution is between 0° and 115° C. The optimum conditions are as follows: concentration of the ferric chloride between 250 and 2000 PPM, temperature of the solution between 50° and 105° C., and the oxidizing time between a half and one hour. Under these conditions, a passivation film of thickness between 20 and 2000 Å can be formed.

In the reaction for forming a passivation film 6, a portion of the $Fe^{3+}$ ions act as a catalyst to cause the following reaction:

$$2H_2O_2 \rightarrow 2H_2O + O_2 \uparrow.$$

A part of the generated oxygen oxidizes the sample (substrate) 18 to form ferrous oxide and ferric oxide. Still further, the following reaction is thought to take place:

$$6H_2O_2 + 2FeCl_3 \rightarrow HCl + 3O_2 \uparrow + 2Fe(OH)_3 \downarrow.$$

The iron hydroxide is also deposited to be absorbed on the surface of the sample 18, while at the same time, oxygen to be generated by the decomposition of hydrogen peroxide will oxidize the sample 18 to form an oxide film. The two oxide films form a passivation film 6.

As explained above, in the presence of $Fe^{3+}$ ions added to the hydrogen peroxide solution, ferrous oxide and ferric oxide and iron hydroxide are deposited on the surface of compound semiconductors of the sample (substrate) 18, while a large amount of oxygen necessary for oxidation is generated by the decomposition of hydrogen peroxide under the catalytic action of the $Fe^{3+}$ ions to form an oxide film on compound semiconductors of the sample 18. Therefore, a passivation film 6 can be formed on the sample 18 stably and reproducibly.

Figure 7:
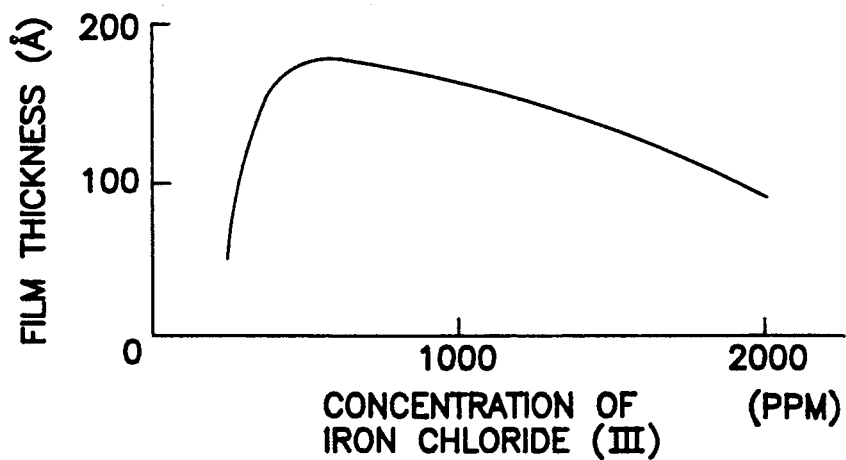
FIG. 7 is a graph of film thickness plotted against the concentration of ferric chloride added to hydrogen peroxide solution.
Figure 8:
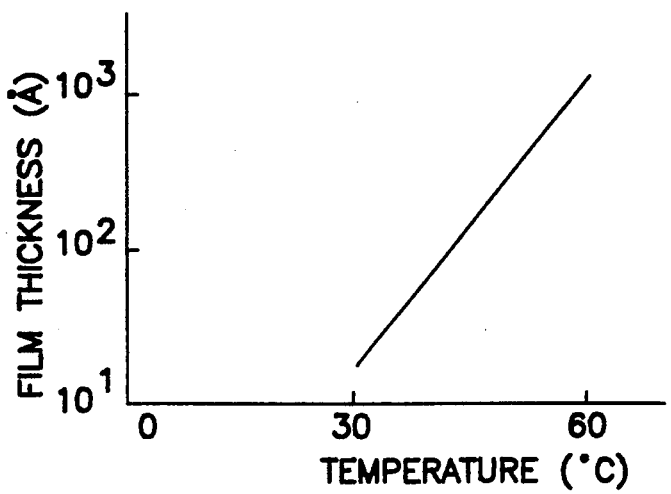
FIG. 8 is a graph of film thickness plotted against the temperature of the solution containing ferric chloride.

The curve 34 in FIG. 3 shows that the leakage current of a passivation film of this Example is small. FIG. 7 shows a relation of the thickness of passivation film 6 produced at 30° C. plotted against the concentration of ferric chloride to be added with respect to the hydrogen peroxide solution, while FIG. 8 shows a relation of the thickness of a passivation film 6, produced at 250 PPM of concentration of ferric chloride, plotted against the temperature of the solution 12.

EXAMPLE 4

In this Example, an aqueous solution of hydrogen peroxide containing ferric chloride is also used for producing a passivation film 6 for a phototransistor as in Example 3.

The formation of a passivation film 6 is performed similarly to Example 3, and a sample 18 of phototransistor as an anode and a cathode 16 of platinum are soaked in the solution 12 and an electric current is supplied from the electric power source 17 between the sample 18 and the cathode 16 for a prescribed time for anodic oxidation of the sample 18.

A passivation film 6 can be deposited if the electric current density is kept between 0.1 and 100 mA/cm², and the optimum condition is between 1 and 3 mA/cm². The conditions on the temperature of the solution 12 and the concentration of ferric chloride are the same as those in Example 3. The oxidizing time is between a quarter and a half hour. By flowing a current in the sample 18, $O^{2-}$ ions are attracted to the sample 18 due to the Coulomb force, while the electrolysis of water takes place to generate oxygen for promoting the reaction. Under these conditions, a passivation film of thickness 2000 Å or more can be formed. The reaction formulas for generation of ferrous oxide, ferric oxide, and iron hydroxide are the same as in Example 3.

As explained above, in the presence of $Fe^{3+}$ ions, ferrous oxide and ferric oxide and iron hydroxide are deposited on the surface of the sample (substrate) 18, while a large amount of oxygen necessary for oxidation is generated to form an oxide film on the sample 18. Therefore, a passivation film 6 can be formed on the sample 18 stably and reproducibly.

It is an advantage of the manufacturing method of this Example that the reaction time can be shortened.

The curve 34 in FIG. 3 shows that the leakage current of a passivation film of this Example is small.

EXAMPLE 5

In this Example, an aqueous solution of hydrogen peroxide containing cuprous chloride is used for producing a passivation film for a phototransistor.

First, aqueous solution of 30% of hydrogen peroxide is supplied through the pipe 22, and powders of cuprous chloride are supplied through the pipe 23 so as to dissolve them in the solution 12. Then, after the solution 12 is heated to a prescribed temperature with the heater 14, a sample 18 of phototransistor is soaked in the solution 12 and then nitrogen gas is introduced through the pipe 21 into the solution 12 in order to prevent the adherence of bubbles on the surface of the sample 18 and to form homogeneously a passivation film on the surface of the sample 18. The solution is stirred with the stirrer 13.

A passivation film 6 can be deposited if the concentration of cuprous chloride is one PPM or more relative to the aqueous solution of hydrogen peroxide and the temperature of the solution is kept between 0° and 115° C. The optimum conditions are as follows: the concentration of the cuprous chloride between 250 and 2000 PPM, temperature of the solution between 50° and 105° C., and the oxidizing time between a half and one hour. Under these conditions, a passivation film of thickness between 10 and 500 Å can be formed.

In the reaction for forming a passivation film 6, a part of the $Cu^+$ ions act as a catalyst to cause the following reaction:

$$2H_2O_2 \rightarrow 2H_2O + O_2 \uparrow,$$

wherein the generated oxygen oxidizes the sample (substrate) 18 to form cuprous oxide and cupric oxide to be deposited or absorbed physically or chemically due to the interaction with the sample 18. The oxygen generated also oxidizes the sample to form an oxide film. Further, a following reaction takes place:

$$6H_2O_2 + CuCl \rightarrow 2Cu(OH)_2 + 2HCl + O_2 \uparrow.$$

Thus, cupric hydroxide is also deposited on the surface of the sample 18, while at the same time, oxygen to be generated will oxidize the sample 18 to form an oxide film.

As explained above, in the presence of $Cu^+$ ions added to the hydrogen peroxide solution, cuprous oxide and cupric oxide and cupric hydroxide are deposited on the surface of compound semiconductors of the sample (substrate) 18, while a large amount of oxygen necessary for oxidization is generated by the decomposition of hydrogen peroxide under the catalytic action of $Cu^+$ ions to form an oxide film on compound semiconductors of the sample 18. Therefore, a passivation film 6 can be formed on the sample 18 stably and reproducibly.

Figure 9:
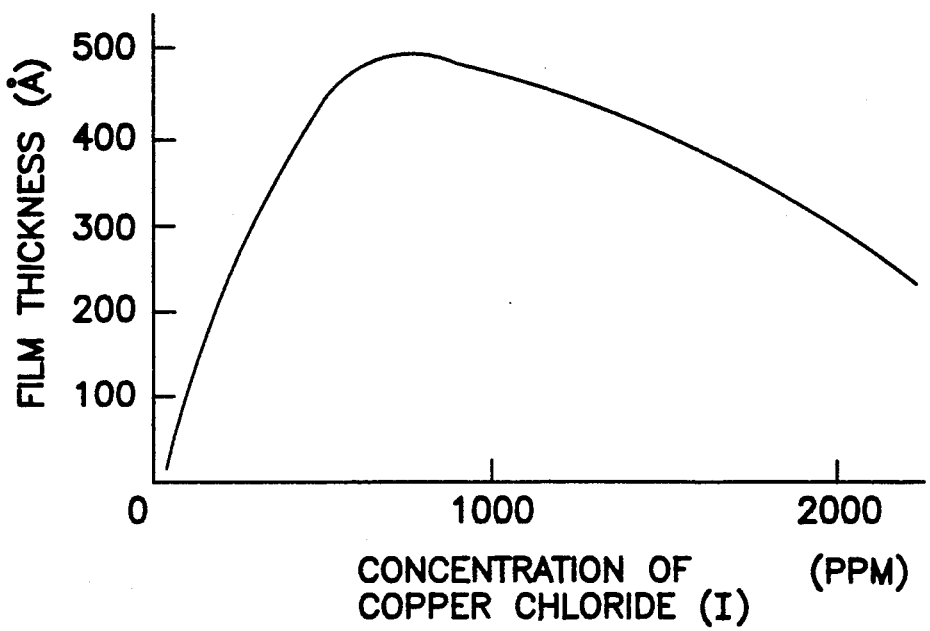
FIG. 9 is a graph of film thickness plotted against the concentration of cuprous chloride added to hydrogen peroxide solution.
Figure 10:
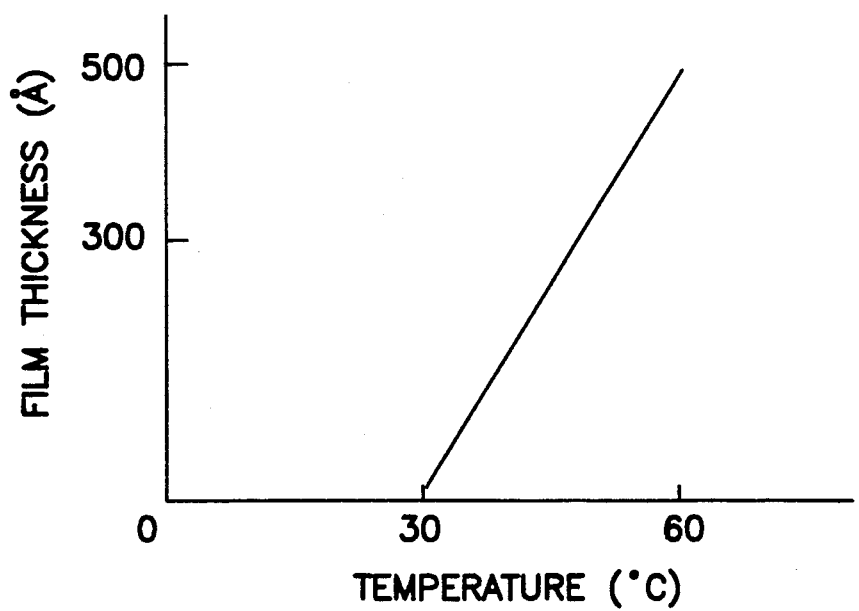
FIG. 10 is a graph of film thickness plotted against the temperature of the solution containing cuprous chloride.

The curve 35 in FIG. 3 shows that the leakage current of a passivation film of this Example is small. FIG. 9 shows a relation of the thickness of passivation film 6 produced at 60° C. plotted against the concentration of cuprous chloride to be added with respect to the hydrogen peroxide solution, while FIG. 10 shows a relation of the thickness of a passivation film 6, produced at 750 PPM of concentration of cuprous chloride, plotted against the temperature of the solution 12.

EXAMPLE 6

In this Example, an aqueous solution of hydrogen peroxide containing cuprous chloride is also used for producing a passivation film 6 for a phototransistor as in Example 5.

The formation of a passivation film 6 is performed similarly to Example 5, and a sample 18 of phototransistor as an anode and a cathode 16 of platinum are soaked in the solution 12 and an electric current is supplied from the electric power source 17 between the sample 18 and the cathode 16 for a prescribed time for anodic oxidation of the sample 18.

A passivation film 6 can be deposited if the electric current density is kept between 0.1 and 100 mA/cm$^2$, and the optimum condition is between 1 and 3 mA/cm$^2$. The conditions on the temperature of the solution 12 and the concentration of cuprous chloride are the same as those in Example 5. The oxidizing time is between a quarter and a half hour. By flowing a current in the sample 18, $O^{2-}$ ions are attracted to the sample 18 due to the Coulomb force, while the electrolysis of water takes place to generate oxygen for promoting the reaction. Under these conditions, a passivation film of thickness 1000 Å or more can be formed. The reaction formulas for generation cuprous oxide, cupric oxide, and cupric hydroxide are the same as in Example 5.

As explained above, in the presence of $Cu^+$ ions, cuprous oxide, cupric oxide and cupric hydroxide are deposited of the surface of the sample (substrate) 18, while a large amount of oxygen necessary for oxidization is generated to form an oxide film on the sample 18. Therefore, a passivation film 6 can be formed on the sample 18 stably and reproducibly.

It is an advantage of the manufacturing method of this Example that the reaction time can be shortened.

The curve 35 in FIG. 3 shows the leakage current of a passivation film of this Example.

EXAMPLE 7

In this Example, an aqueous solution of hydrogen peroxide containing cupric chloride is used for producing a passivation film for a phototransistor.

First, aqueous solution of 30% hydrogen peroxide is supplied through the pipe 22, and powders of cupric chloride are supplied through the pipe 23 so as to dissolve them in the solution 12. Then, after the solution 12 is heated to a prescribed temperature with the heater 14, a sample 18 of phototransistor is soaked in the solution 12 and then nitrogen gas is introduced through the pipe 21 into the solution 12 in order to prevent the adherence of bubbles on the surface of the sample 18 and to form homogeneously a passivation film on the surface of the sample 18. The solution is stirred with the stirrer 13.

A passivation film 6 can be deposited if the concentration of cupric chloride is kept at one PPm or more relative to the aqueous solution of hydrogen peroxide and the temperature of the solution is kept between 0° and 115° C. The optimum conditions are as follows: concentration of the cupric chloride between 250 and 2000 PPM, temperature of the solution between 50° and 105° C., and the oxidizing time between a half and one hour. Under these conditions, a passivation film of thickness between 10 and 500 Å can be formed.

In the reaction for forming a passivation film 6, a part of the $C^{2+}$ ions act as a catalyst to cause the following reaction:

$$2H_2O_2 \rightarrow 2H_2O + O_2 \uparrow,$$

wherein a part of the generated oxygen reacts with $Cu^{2+}$ to form cuprous oxide and cupric oxide to be deposited or absorbed physically or chemically due to the interaction with the sample 18. The oxygen generated also oxidizes the sample to form an oxide film. Further, the following reaction takes place:

$$2H_2O_2 + CuCl_2 \rightarrow Cu(OH)_2 + 2HCl + O_2 \uparrow .$$

Thus, copper hydroxide is also adsorbed or deposited on the surface of the sample 18, while at the same time, oxygen to be generated will oxidize the sample 18 to form an oxide film.

As explained above, in the presence of $Cu^{2+}$ ions added to the hydrogen peroxide solution, cuprous oxide and cupric oxide and cupric hydroxide are deposited on the surface of the sample (substrate) 18, while a large amount of oxygen necessary for oxidization is generated by the decomposition of the hydrogen peroxide under the catalytic action of $Cu^{2+}$ ions to form an oxide film on compound semiconductors of the sample 18. Therefore, a passivation film 6 can be formed on the sample 18 stably and reproducibly.

Figure 11:
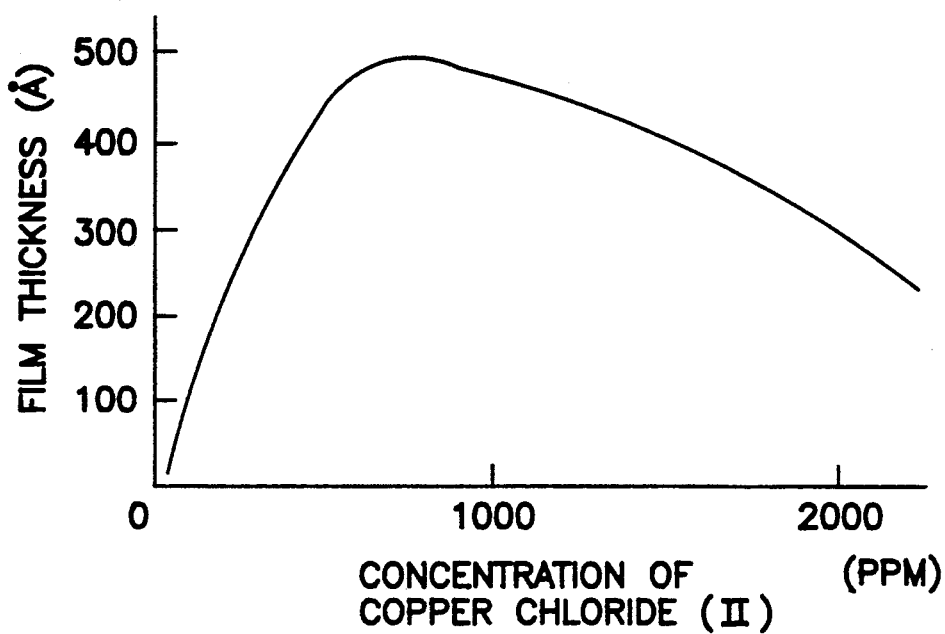
FIG. 11 is a graph of film thickness plotted against the concentration of cupric chloride added to hydrogen peroxide solution.
Figure 12:
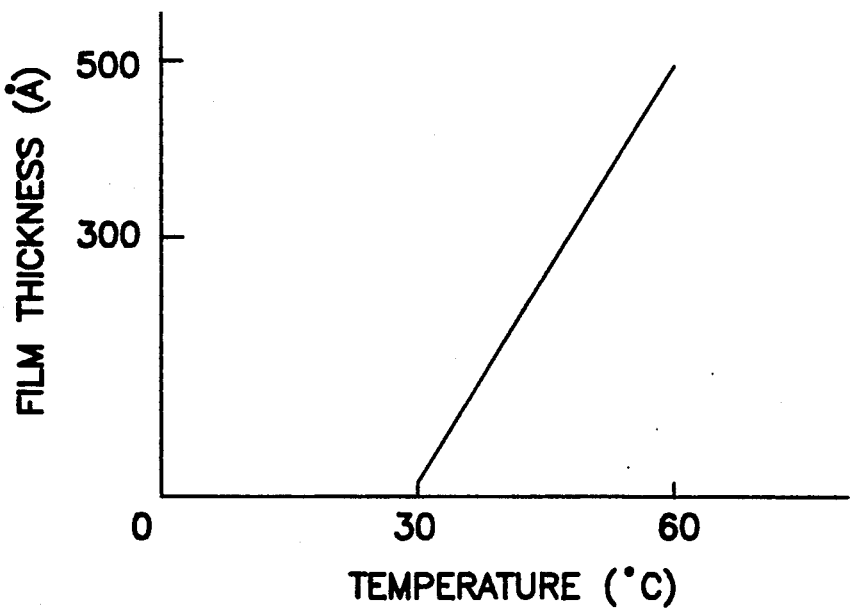
FIG. 12 is a graph of film thickness plotted against the temperature of the solution containing cupric chloride.

The curve 36 in FIG. 3 shows that the leakage current of a passivation film of this Example is small. FIG. 11 shows a relation of the thickness of passivation film 6 produced at 60° C. plotted against the concentration of cupric chloride to be added with respect to the hydrogen peroxide solution, while FIG. 12 shows a relation of the thickness of a passivation film 6, produced at 750 PPM of concentration of cupric chloride, plotted against the temperature of the solution 12.

EXAMPLE 8

In this Example, an aqueous solution of hydrogen peroxide containing cupric chloride is also used for producing a passivation film 6 for a phototransistor as in Example 7.

The formation of a passivation film 6 is performed similarly to Example 7, and a sample 18 of phototransistor as an anode and a cathode 16 of platinum are soaked in the solution 12 and an electric current is supplied from the electric power source 17 between the sample 18 and the cathode 16 for a prescribed time for anodic oxidation of the sample 18.

A passivation film 6 can be deposited if the electric current density is kept between 0.1 and 100 mA/cm$^2$, and the optimum condition is between 1 and 3 mA/cm$^2$. The conditions on the temperature of the solution 12 and the concentration of cupric chloride are the same as those in Example 7. The oxidizing time is between a quarter and a half hour. By flowing a current in the sample 18, $O^{2-}$ ions are attracted to the sample 18 due to the Coulomb force, while the electrolysis of water takes place to generate oxygen for promoting the reaction. Under these conditions, a passivation film of thickness 1000 Å or more can be formed. The reaction formulas for generation cuprous oxide, cupric oxide, and cupric hydroxide are the same as in Example 7.

As explained above, in the presence of $Cu^{2+}$ ions, cuprous oxide and cupric oxide and copper hydroxide are deposited on the surface of the sample (substrate) 18, while a large amount of oxygen necessary for oxidization is generated to form an oxide film on the sample 18. Therefore, a passivation film 6 can be formed on the sample 18 stably and reproducibly.

It is an advantage of the manufacturing method of this Example that the reaction time can be shortened.

The curve 36 in FIG. 3 shows that the leakage current of a passivation film of this Example is small.

EXAMPLE 9

In this Example, an aqueous solution of hydrogen peroxide containing cobaltous chloride is used for producing a passivation film for a phototransistor.

First, aqueous solution of 30% of hydrogen peroxide is supplied through the pipe 22, and powders of cobaltous chloride are supplied through the pipe 23 so as to dissolve them in the solution 12. Then, after the solution 12 is heated to a prescribed temperature with the heater 14, a sample 18 of phototransistor is soaked in the solution 12 and then nitrogen gas is introduced through the pipe 21 into the solution 12 in order to prevent the adherence of bubbles on the surface of the sample 18 and to form homogeneously a passivation film on the surface of the sample 18. The solution is stirred with the stirrer 13.

A passivation film 6 can be deposited if the concentration of cobaltous chloride is kept one PPM or more relative to the aqueous solution of hydrogen peroxide and the temperature of the solution is kept between 0° and 115° C. The optimum conditions are as follows: concentration of the cobaltous chloride between 250 and 2000 PPM, temperature of the solution between 50° and 105° C., and the oxidizing time between a half and one hour. Under these conditions, a passivation film of thickness between 50 and 600 Å can be formed.

In the reaction for forming a passivation film 6, a part of the $Co^{2+}$ ions act as a catalyst to cause the following reaction:

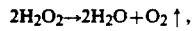

$$2H_2O_2 \rightarrow 2H_2O + O_2 \uparrow ,$$

wherein a part of the generated oxygen reacts with $Co^{2+}$ to form cobaltous oxide to be deposited or absorbed physically or chemically due to the interaction with the sample 18. The oxygen generated also oxidizes the sample to form an oxide film. Further, a following reaction takes place:

$$2H_2O_2 + CoCl_2 \rightarrow Co(OH)_2 \, 2HCl + O_2 \uparrow .$$

Thus, cobaltous hydroxide is also adsorbed or deposited on the surface of the sample 18, while at the same time, oxygen to be generated will oxidize the sample 18 to form an oxide film.

As explained above, in the presence of $Co^{2+}$ ions added to the hydrogen peroxide, cobaltous oxide and cobaltous hydroxide are deposited of the surface of compound semiconductors of the sample (substrate) 18, while a large amount of oxygen necessary for oxidization is generated by the decomposition of the hydrogen peroxide under the catalytic action of $Co^{2+}$ to form an oxide film on compound semiconductors of the sample 18. Therefore, a passivation film 6 made from the cobaltous oxide, cobaltous hydroxide and an oxide film of the sample can be formed on the sample 18 stably and reproducibly.

Figure 13:
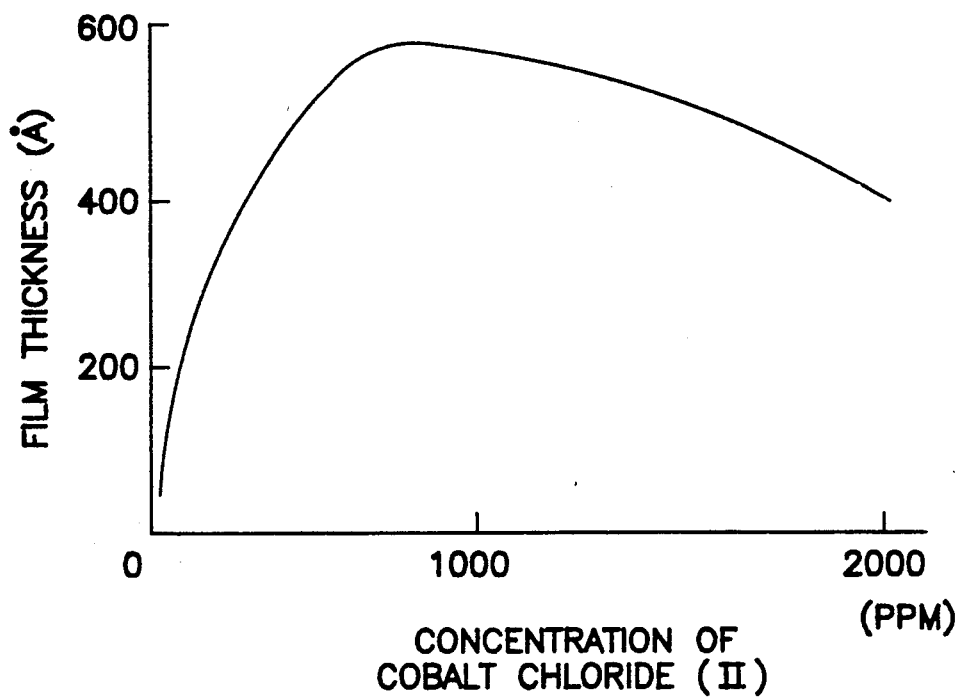
FIG. 13 is a graph of film thickness plotted against the concentration of cobaltous chloride added to hydrogen peroxide solution.
Figure 14:
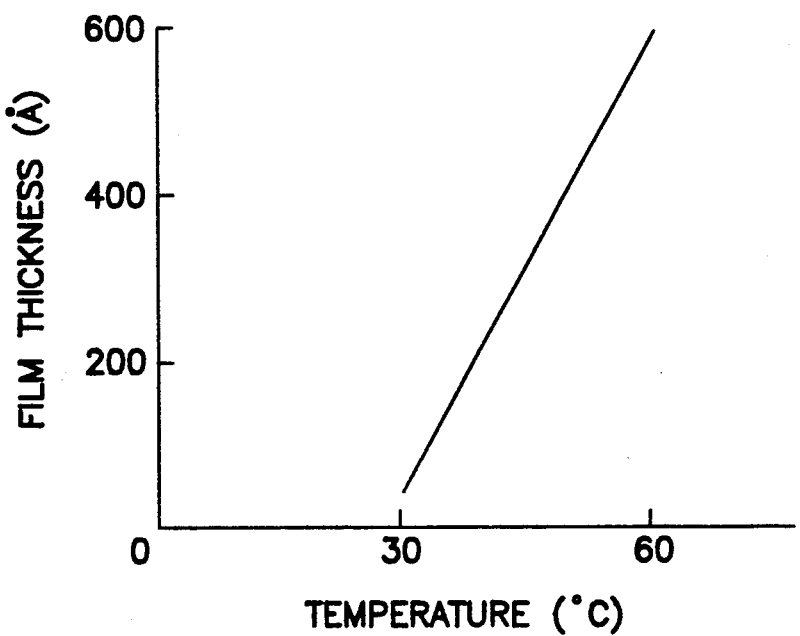
FIG. 14 is a graph of film thickness plotted against the temperature of the solution containing cobaltous chloride.

The curve 37 in FIG. 3 shows that the leakage current of a passivation film of this Example is small. FIG. 13 shows a relation of the thickness of passivation film 6, produced at 60° C. plotted against the concentration of cobaltous chloride to be added with respect to the hydrogen peroxide solution, while FIG. 14 shows a relation of the thickness of a passivation film 6, produced at 750 PPM of concentration of cobaltous chloride, plotted against the temperature of the solution 12.

EXAMPLE 10

In this Example, an aqueous solution of hydrogen peroxide containing cobaltous chloride is also used for producing a passivation film 6 for a phototransistor as in Example 9.

The formation of a passivation film 6 is performed similarly to Example 9, and a sample 18 of phototransistor as an anode and a cathode 16 of platinum are soaked in the solution 12 and an electric current is supplied from the electric power source 17 between the sample 18 and the cathode 16 for a prescribed time for anodic oxidation of the sample 18.

A passivation film 6 can be deposited if the electric current density is kept between 0.1 and 100 mA/cm$^2$, and the optimum condition is between 1 and 3 mA/cm$^2$. The conditions on the temperature of the solution 12 and the concentration of cobaltous chloride are the same as those in Example 9. The oxidizing time is between a quarter and a half hour. By flowing a current in the sample 18, $O^{2-}$ ions are attracted to the sample 18 due to the Coulomb force, while the electrolysis of water takes place to generate oxygen for promoting the reaction. Under these conditions, a passivation film of thickness 1000 Å or more can be formed. The reaction formulas for generation cobaltous oxide, and cobaltous hydroxide are the same as in Example 9.

As explained above, in the presence of $Co^{2+}$ ions, cobaltous oxide and cobaltous hydroxide are deposited on the surface of the sample (substrate) 18, while a large amount of oxygen necessary for oxidization is generated to form an oxide film on the sample 18. Therefore, a passivation film 6 can be formed on the sample 18 stably and reproducibly.

It is an advantage of the manufacturing method of this Example that the reaction time can be shortened.

The curve 37 in FIG. 3 shows that the leakage current of a passivation film of this Example is small.

EXAMPLE 11

In this Example, an aqueous solution of hydrogen peroxide containing chromous chloride is used for producing a passivation film for a phototransistor.

First, aqueous solution of 30% hydrogen peroxide is supplied through the pipe 22, and powders of chromous chloride are supplied through the pipe 23 so as to dissolve them in the solution 12. Then, after the solution 12 is heated to a prescribed temperature with the heater 14, a sample 18 of phototransistor is soaked in the solution 12 and then nitrogen gas is introduced through the pipe 21 into the solution 12 in order to prevent the adherence of bubbles on the surface of the sample 18 and to form homogeneously a passivation film on the surface of the sample 18. The solution is stirred with the stirrer 13.

A passivation film 6 can be deposited if the concentration of chromous chloride is kept one PPM or more relative to the aqueous solution of hydrogen peroxide and the temperature of the solution is kept between 0° and 115° C. The optimum conditions are as follows: concentration of the chromous chloride between 250 and 2000 PPM, temperature of the solution between 50° and 105° C., and the oxidizing time between a half and one hour. Under these conditions, a passivation film of thickness between 50 and 600 Å can be formed.

In the reaction for forming a passivation film 6, a part of the $Cr^{2+}$ ions act as a catalyst to cause the following reaction:

$$2H_2O_2 \rightarrow 2H_2O + O_2 \uparrow,$$

wherein a part of the generated oxygen reacts with $Cr^{2+}$ to form chromous oxide to be deposited or absorbed physically or chemically due to the interaction with the sample 18. The oxygen generated also oxidizes the sample to form an oxide film. Further, a following reaction takes place:

$$2H_2O_2 + CrCl_2 \rightarrow Cr(OH)_2 + 2HCl + O_2 \uparrow.$$

Thus, chromous hydroxide is also adsorbed or deposited on the surface of the sample 18, while at the same time, oxygen to be generated will oxidize the sample 18 to form an oxide film.

As explained above, in the presence of $Cr^{2+}$ ions added to the hydrogen peroxide solution, chromous oxide and chromous hydroxide are deposited on the surface of compound semiconductors of the sample (substrate) 18, while a large amount of oxygen necessary for oxidization is generated by the decomposition of hydrogen peroxide under the catalytic action of $Cr^{2+}$ ions to form an oxide film on compound semiconductors of the sample 18. Therefore, a passivation film 6 made from the chromous oxide, chromous hydroxide and an oxide film of the sample can be formed on the sample 18 stably and reproducibly.

Figure 15:
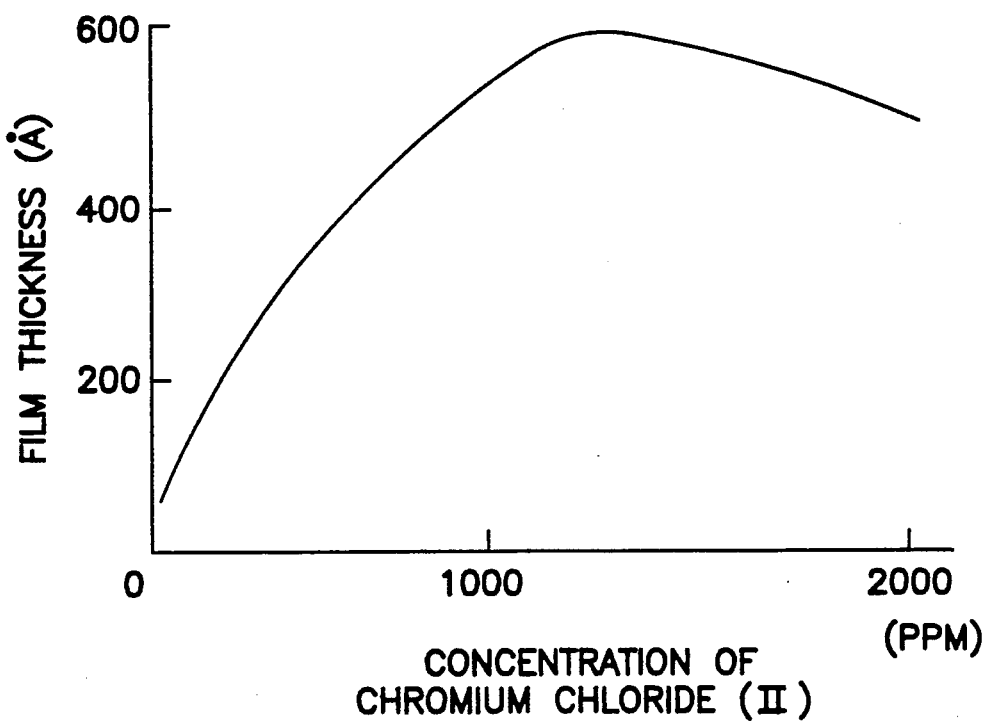
FIG. 15 is a graph of film thickness plotted against the concentration of chromous chloride added to hydrogen peroxide solution.
Figure 16:
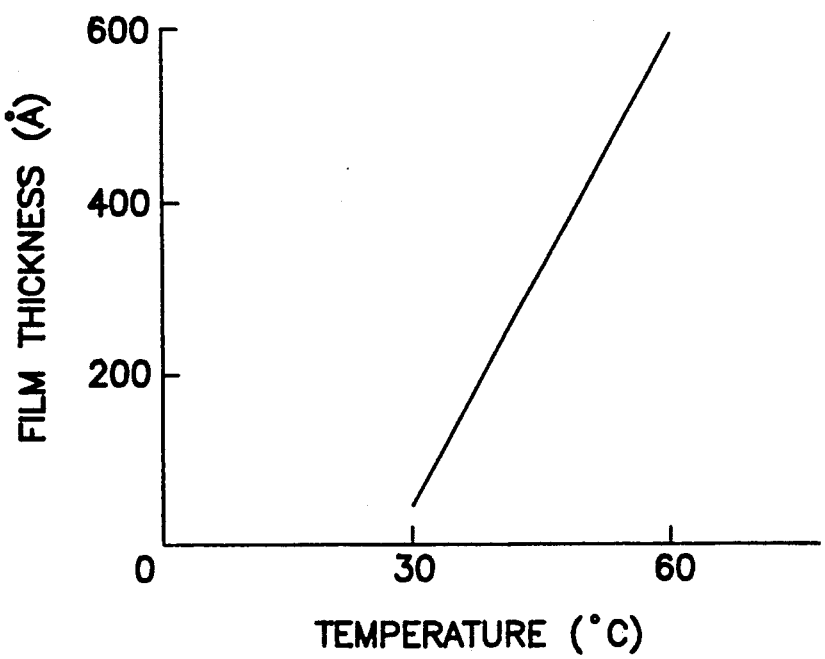
FIG. 16 is a graph of film thickness plotted against the temperature of the solution containing chromous chloride.

The curve 38 in FIG. 3 shows that the leakage current of a passivation film of this Example is small. FIG. 15 shows a relation of the thickness of passivation film 6 produced at 60° C. plotted against the concentration of chromous chloride to be added with respect to the hydrogen peroxide solution, while FIG. 16 shows a relation of the thickness of a passivation film 6, produced at 1250 PPM of concentration of chromous chloride, plotted against the temperature of the solution 12.

EXAMPLE 12

In this Example, an aqueous solution of hydrogen peroxide containing chromous chloride is also used for producing a passivation film 6 for a phototransistor as in Example 11.

The formation of a passivation film 6 is performed similarly to Example 11, and a sample 18 of phototransistor as an anode and a cathode 16 of platinum are soaked in the solution 12 and an electric current is supplied from the electric power source 17 between the sample 18 and the cathode 16 for a prescribed time for anodic oxidation of the sample 18.

A passivation film 6 can be deposited if the electric current density is kept between 0.1 and 100 mA/cm$^2$, and the optimum condition is between 1 and 3 mA/cm$^2$. The conditions on the temperature of the solution 12 and the concentration of chromous chloride are the same as those in Example 11. The oxidizing time is between a quarter and a half hour. By flowing a current in the sample 18, $O^{2-}$ ions are attracted to the sample 18 due to the Coulomb force, while the electrolysis of water takes place to generate oxygen for promoting the reaction. Under these conditions, a passivation film of thickness 1000 Å or more can be formed. The reaction formulas for generation chromous oxide, and chromous hydroxide are the same as in Example 11.

As explained above, in the presence of $Cr^{2+}$ ions, chromous oxide and chromous hydroxide are deposited on the surface of the sample (substrate) 18, while a large amount of oxygen necessary for oxidization is generated to form an oxide film on the sample 18. Therefore, a passivation film 6 can be formed on the sample 18 stably and reproducibly.

It is an advantage of the manufacturing method of this Example that the reaction time can be shortened.

The curve 38 in FIG. 3 shows that the leakage current of a passivation film of this Example is small.

In the above-mentioned examples, a phototransistor including InP is used as the sample 18. However, a passivation film according to the present invention can also be applied similarly to a phototransistor including GaAs, InAs, GaP, InSb or the like. Further, in the above-mentioned examples, chlorides are used as a source for metallic ions. However, other halogenides, sulfates, carboxylates or the like including the metallic ions can also be used as the source.

In the above-mentioned examples 2, 4, 6, 8, 10 and 12, anodic oxidation is performed with the constant current process. However, the anodic oxidation can also be performed with the constant voltage process or with a combination of the constant current process and the constant voltage process.

EXAMPLE 13

Figure 17:
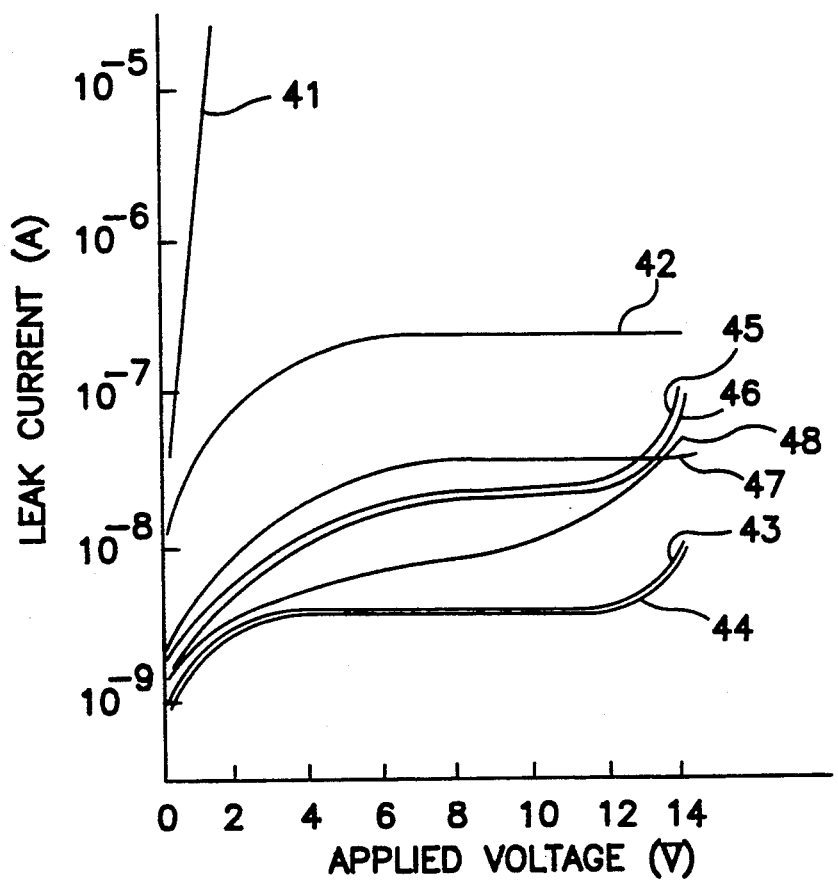
FIG. 17 is a graph of leakage current of GaAs phototransistors plotted against bias voltage.

Passivation films explained above can also to be applied to a GaAs phototransistor of a structure similar to that shown in FIG. 1, wherein the phototransistor (not shown) comprises an emitter made of n-GaAs, a base made of p-InGaAs and a collector made of n-GaAs are applied to a GaAs substrate successively. FIG. 17 shows the data of leakage current of various phototransistors with passivation films, to be explained below, plotted against the applied voltage (bias voltage), wherein the numeral 41 designates a curve for a passivation film made of $SiO_2$ and 42 for a passivation film made of $Si_3N_4$ for comparison with passivation films of embodiments of the present invention. On the other hand, curves 43 to 48 relate to passivation films of embodiments of the present invention. The numeral 43 designates a curve for a passivation film produced with use of hydrogen peroxide and $Fe^{2+}$, 44 with use of hydrogen peroxide and $Fe^{3+}$, 45 with use of hydrogen peroxide and $Cu^+$, 46 with use of hydrogen peroxide and $Cu^{2+}$, 47 with use of hydrogen peroxide and $Co^{2+}$, while 48 with use of hydrogen peroxide and $Cr^{2+}$ according to the present invention. The data show clearly that the leakage current is improved largely by using a passivation film of the present invention.

EXAMPLE 14

Figure 18:
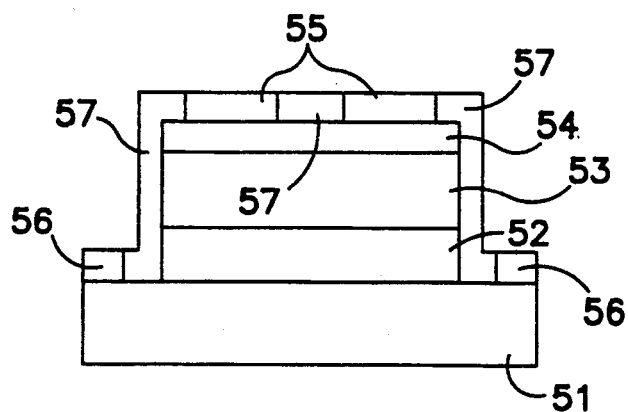
FIGS. 18, 19 and 20 are schematic sectional views of various types of light-emitting diodes with a passivation film.
Figure 19:
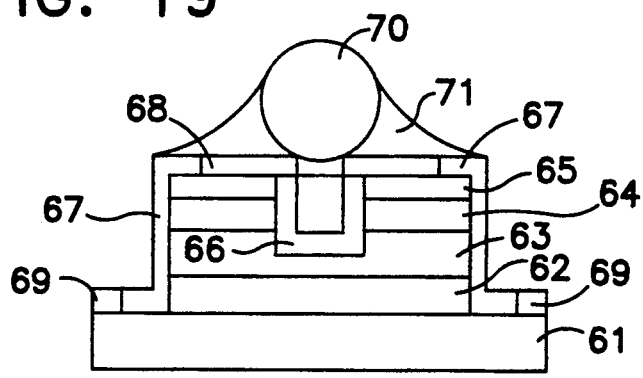
Figure 20:
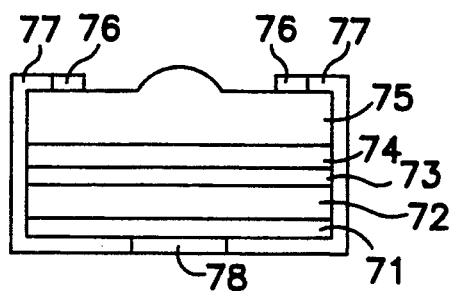

FIGS. 18 to 20 are schematic sectional views of various types of light-emitting diodes with a passivation film. FIG. 18 shows a schematic sectional view of a phototransistor, wherein an active layer 52 made of InGaAsP, a p-InP layer 53 and a p-InGaAsP layer 54 are applied to an n-InP substrate 51 successively. Further, a passivation film 57 according to the present invention covers the layers 51–54, and p-type and n-type electrodes 55 and 56 are connected to the collector 54 and to the substrate 51, respectively.

EXAMPLE 15

FIG. 19 shows a schematic sectional view of a light-emitting diode, wherein an n-InGaAsP layer 62, an InP layer 63 as an active layer, an n-InGaAsP layer 64 and a p-InGaAsP layer 65 are applied to an n-type InP substrate 61 successively. A hole from the surface of the p-type InGaAsP layer 65 into the InP layer 63 is provided, and then zinc atoms are diffused in a region 66 around the hole. Next, a passivation film 70 according to the present invention coats the surface, respectively. Further, and p-type and n-type electrodes 68 and 69 are connected to the p-InGaAsP layer 65 and to the substrate 61, respectively. Further, a ball-like glass lens 70 is adhered to the top of the device with epoxy resin 71.

EXAMPLE 16

FIG. 20 shows a schematic sectional view of a light-emitting diode, wherein a P-InP layer 72, an n-InGaAsP layer 73, an n-InP layer 74 and another n-InP layer 75 are applied successively to a p-type InGaAs layer 71 successively. Further, a passivation film 77 according to the present invention coats the layers 71 and 75 except a central area of the n-InP layer 75 wherein a bump is formed for light-emitting, and n-type and p-type electrodes 76 and 78 are connected to the n-InP layer and to the p-InGaAs layer 71, respectively.

EXAMPLE 17

Figure 21:
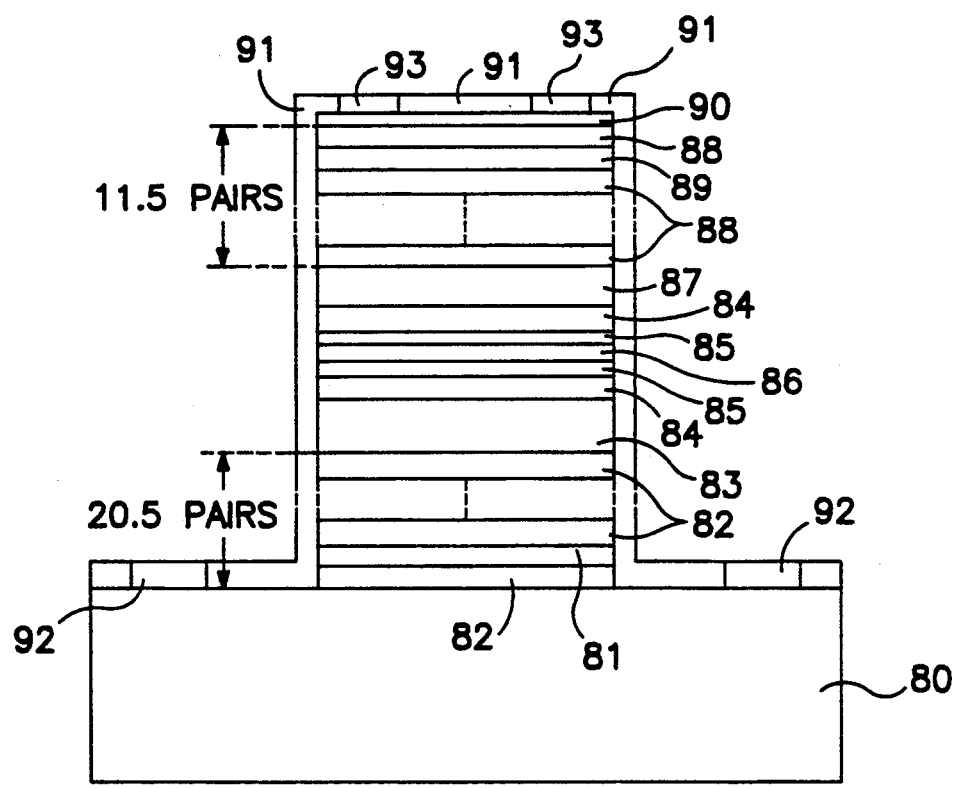
FIG. 21 is a schematic sectional view of a vertical cavity surface emitting laser.

FIG. 21 is a schematic sectional view of a vertical catity surface emitting laser, wherein twenty pairs of an n-GaAs layer 81 and an n-AlAs layer 82 and then another n-GaAs layer 82 are applied to an n-GaAs substrate 80 successively. Then, an n-AlGaAs layer 83, an AlGaAs layer 84, a GaAs layer 85, an InGaAs layer 86, a GaAs layer 85, an AlGaAs layer 84 and a p-AlGaAs layer 87 are applied successively. Still further, eleven pairs of a p-AlAs layer 88 and a p-GaAs layer 89 and then a p-AlAs layer 88 are applied successively. Finally, after a $p^+$-GaAs layer 90 is applied, a passivation film 91 coats the substrate 80 and the layers 81 to 90. Then, n-type contact electrodes 92 and p-type contact electrodes 93 are connected to the substrate 80 and to the top layer 90, respectively.

It is understood that various other modifications will be apparent to and can be readily made by those skilled in the art without departing from the scope and spirit of the present invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the present invention pertains.

What is claimed is:

1. A method for producing a passivation film on the surface of a semiconductor device including an InP compound semiconductor, comprising the steps of:
    a. providing a solution of hydrogen peroxide containing metallic ions of iron, copper, chromium or cobalt, the concentration of the metallic ions in the solution being between 250 and 2000 ppm, the temperature of the solution being controlled between 50° and 115° C.; and
    b. soaking a semiconductor device including said InP compound semiconductor in the solution;
    whereby a passivation film is formed in the solution on the surface of the semiconductor device, and the passivation film includes an oxide of the InP compound in the semiconductor device, and an oxide and a hydroxide of the metallic ions.

2. A method for producing a passivation film on the surface of a semiconductor device including an InP compound semiconductor, comprising the steps of:
    a. providing a solution of hydrogen peroxide containing metallic ions of iron, copper, chromium or cobalt, the concentration of the metallic ions in the solution being between 250 and 2000 ppm; and
    b. conducting anodic oxidation of a semiconductor device including said InP compound semiconductor in the solution, the anodic oxidation being performed at a current density between 1 and 3 $mA/cm^2$;
    whereby a passivation film is formed in the solution on the surface of the semiconductor device, and the passivation film includes an oxide of the InP compound in the semiconductor device, and an oxide and a hydroxide of the metallic ions.

* * * * *